United States Patent
Smith et al.

(10) Patent No.: US 7,268,302 B1
(45) Date of Patent: Sep. 11, 2007

(54) LOW INDUCTANCE MOUNT FOR DECOUPLING CAPACITORS

(75) Inventors: Lawrence D. Smith, San Jose, CA (US); Michael C. Freda, Morgan Hill, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 143 days.

(21) Appl. No.: 11/037,709

(22) Filed: Jan. 18, 2005

(51) Int. Cl.
*H05K 1/03* (2006.01)

(52) U.S. Cl. ..................................... 174/255

(58) Field of Classification Search .............. 174/255; 361/306.1–306.3, 311–313, 763, 766, 821, 361/822
See application file for complete search history.

(56) References Cited

U.S. PATENT DOCUMENTS

| 6,215,372 B1 | 4/2001 | Novak |
| 6,229,095 B1 * | 5/2001 | Kobayashi .................. 174/255 |
| 6,940,458 B2 | 9/2005 | Mukai et al. |
| 6,941,537 B2 | 9/2005 | Jessep et al. |
| 2001/0018982 A1 * | 9/2001 | Gotoh et al. |
| 2004/0070956 A1 * | 4/2004 | Antu et al. |

* cited by examiner

*Primary Examiner*—Dean A. Reichard
*Assistant Examiner*—Yuriy Semenenko
(74) *Attorney, Agent, or Firm*—Meyertons Hood Kivlin Kowert & Goetzel, P.C.; Erik A. Heter

(57) ABSTRACT

A low inductance mount for decoupling capacitors. In one embodiment, a circuit carrier such as a printed circuit board (PCB) includes a surface layer, a first layer adjacent to the surface layer, and a second layer adjacent to the first layer. A conductive region is implemented on the surface layer, and is electrically coupled to a first circuit plane in the first layer. At least one mounting pad is located on the surface layer of the PCB within the conductive region. The mounting pad is electrically isolated from the remainder of the conductive region and is electrically coupled to a second circuit plane in the second layer. A capacitor is mounted on the PCB, wherein a first terminal of the capacitor is coupled to the conductive region and a second terminal is coupled to the mounting pad.

12 Claims, 3 Drawing Sheets

LOW INDUCTANCE MOUNT FOR DECOUPLING CAPACITORS

BACKGROUND OF THE INVENTION

1. Field of the Invention

This invention relates to electronic systems, and more particular, for decoupling power distribution systems.

2. Description of the Related Art

In modern computers and other electronic systems, there is an ever-increasing demand for low-voltage, high-current power. Computer systems that draw 100 amperes of current at 1 volt are not uncommon. In order to make such low-voltage, high-current power distribution feasible, impedance in the power distribution system must be kept to a bare minimum.

In a power distribution system, inductance (and more particularly, inductive impedance) between the power source and the load is undesirable. Such inductive impedance can lead to higher levels of noise in the power distribution system, and this in turn can cause the release of electromagnetic energy that results in EMI (electromagnetic interference) or EMC (electromagnetic coupling). Power distribution system noise is a product of its impedance and its current. Thus, it is especially important to keep impedance at a minimum in today's computer systems, which often draw a high amount of current.

Inductive impedance in a power distribution system may be reduced by the use of decoupling capacitors. However, Equivalent Series Inductance, or ESL, (sometimes referred to as mounted inductance) may reduce the effect of providing decoupling capacitors. The ESL of a capacitor is that inductance associated with its mounting on a printed circuit board (PCB) or other circuit carrier. A capacitor's ESL is a function of both the internal capacitor characteristics and its mounting on the PCB (which includes various factors such as mounting geometry of the capacitor).

The impedance of a power distribution system is typically controlled using capacitance. Since the impedance provided by a capacitor is inversely proportional to its capacitance, the addition of capacitors between a power node and a reference (e.g., ground) node of a power distribution system reduces its overall impedance. However, the ability of capacitors to reduce the overall impedance of a power distribution system is limited. One factor is the ESL discussed above, as this is an inherent property of any capacitor. Another factor is the loop inductance, that is, the inductance in the current loop between power and ground (and which passes through the capacitor). Typically, capacitors are mounted on a surface of a printed circuit board (PCB) or other type of circuit carrier, while power and ground planes are located several layers below the surface. Surface pads to which the connectors are mounted are connected to the power and ground planes, respectively, through vias. The vias provide a vertical connection between the power/ground planes and their respective surface mounting pads. Since the inductive impedance is a distributed parameter, the impedance rises in proportion with the length of the current loop.

SUMMARY OF THE INVENTION

A low inductance mount for decoupling capacitors is disclosed. In one embodiment, a circuit carrier such as a printed circuit board (PCB) includes a surface layer, a first layer adjacent to the surface layer, and a second layer adjacent to the first layer. A conductive region is implemented on the surface layer, and is electrically coupled to a first circuit plane in the first layer. At least one mounting pad is located on the surface layer of the PCB within the conductive region. The mounting pad is electrically isolated from the remainder of the conductive region and is electrically coupled to a second circuit plane in the second layer. A capacitor may be mounted on the PCB, wherein a first terminal of the capacitor is coupled to the conductive region and a second terminal is coupled to the mounting pad.

In one embodiment, a plurality of mounting pads is implemented within the conductive region. Each of the mounting pads is electrically isolated from the remainder of the conductive region, and is electrically coupled to the second circuit plane. A plurality of capacitors may be mounted to the PCB, each having a first terminal coupled (e.g. soldered) to the conductive region and a second terminal coupled to the mounting pad. Gaps may be present in the conductive region near the first terminal of each mounted capacitor. This may aid in the positioning of the capacitor, and prevent it from drifting during the soldering process.

In various embodiments, the first layer may be adjacent to the surface layer, while the second layer may be adjacent to the first. The first circuit plane may be a power plane, with the second circuit layer being a corresponding ground plane. Conversely, the first circuit plane may be a ground plane with the second circuit plane being the corresponding power plane.

BRIEF DESCRIPTION OF THE DRAWINGS

Other aspects of the invention will become apparent upon reading the following detailed description and upon reference to the accompanying drawings in which.

DETAILED DESCRIPTION OF THE INVENTION

Figure 1:
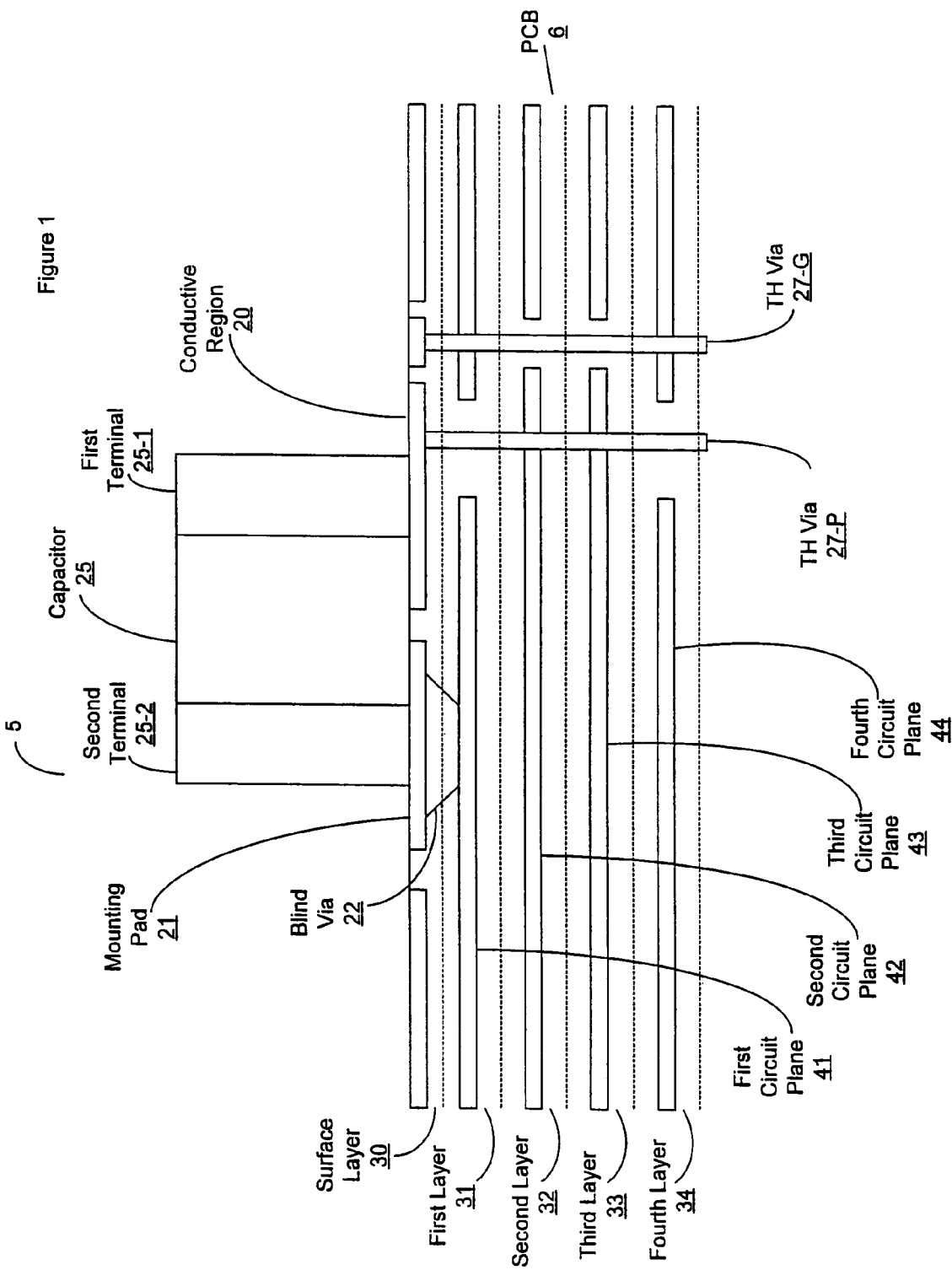
FIG. 1 is a side view of one embodiment of a printed circuit board (PCB) having a surface conductive region for mounting decoupling capacitors.

Turning now to FIG. 1, a side view of one embodiment of an electronic assembly is shown. In the embodiment shown, electronic assembly 5 includes printed circuit board (PCB) 6 with a surface conductive region 20 for mounting decoupling capacitors.

PCB 6 includes a plurality of layers, including surface layer 30, first layer 31, second layer 32, third layer 33 and fourth layer 34. Embodiments having a greater or lesser number of layers are possible and contemplated. Each of the layers may include various materials, such as fiberglass, various types of metal, and any other material typically used in the construction of PCB's.

Each of the first, second, third, and fourth layers in this embodiment includes a circuit plane. First layer 31 includes first circuit plane 41, second layer 32 includes second circuit plane 42, and so on. Each of the circuit planes may be a planar conductor used in power distribution, and can be made from any suitable conductive material. For example first circuit plane 41 may be a ground plane, while second circuit plane 42 may be a power plane. In this particular embodiment, fourth circuit plane 44 is electrically coupled by TH (through-hole) via 27-G to first circuit plane 41, and thus may also be a ground plane. Similarly, third circuit plane 43 is electrically coupled to second circuit plane 42 by TH via 27-P in this embodiment, and may therefore be a power plane. Each of the circuit planes is substantially continuous, although apertures to allow for the passage of signal vias or power distribution vias (e.g., TH vias 27-G and 27-P) may be present.

It should be noted that configurations wherein the first circuit plane 41 (and any planes electrically coupled thereto) are power planes while second circuit plane 42 (and any planes electrically coupled thereto) are ground planes are also possible and contemplated. Additional layers having additional circuit planes are also possible and contemplated. These additional circuit planes may be electrically coupled to those shown in this embodiment, or may be associated with a separate power distribution path (e.g., in an electronic assembly requiring power at more than one voltage).

Although not explicitly shown, one or more signal layers through which signals are conveyed to other devices (also not shown) mounted thereupon may be included in PCB 6. These signal layers may be interspersed with the layers shown here. In other words, one or more signal layers may be present between various ones of the layers having circuit planes for the power distribution system. In the embodiment shown, the arrangement of first layer 31 (having first circuit plane 41) directly adjacent to surface layer 30, while arranging second layer 32 (having second circuit plane 42) directly adjacent to first layer 31, may minimize the distance that current must travel in the power distribution system. By minimizing this distance, the loop inductance (and therefore impedance of the power distribution system) may be less than that in embodiments where the power and ground planes are not in layers that are nearest to the surface layer.

Surface layer 30 is the top-most (and outer-most) layer in the embodiment shown. A conductive region 20 (which will be illustrated in further detail below) is present on a portion of surface layer 30. The conductive region may be suitable for mounting one or more capacitors for decoupling the power distribution system.

In the embodiment shown, electronic assembly 5 includes a capacitor 25 mounted on PCB 6. A first terminal 25-1 of capacitor 25 is coupled to conductive region 20, while a second terminal 25-2 is electrically coupled to a mounting pad 21. Mounting pad 21 is located within the confines of conductive region 20, and is electrically isolated therefrom. The first and second terminals of capacitor 25 may be attached to conductive region 20 and mounting pad 21, respectively, by soldering or any other suitable method for attaching and securing the terminals.

A blind via 22 electrically couples mounting pad 21 (and therefore second terminal 25-2) to first circuit plane 41. First terminal 25-1 is electrically coupled to second circuit plane 42 through conductive region 20 and TH via 27-P. Thus, capacitor 25 provides decoupling for a power distribution system that uses first circuit plane 41 and second circuit plane 42 as ground and power planes (wherein either of the planes may be the ground plane, while the other plane is the associated power plane).

Figure 2:
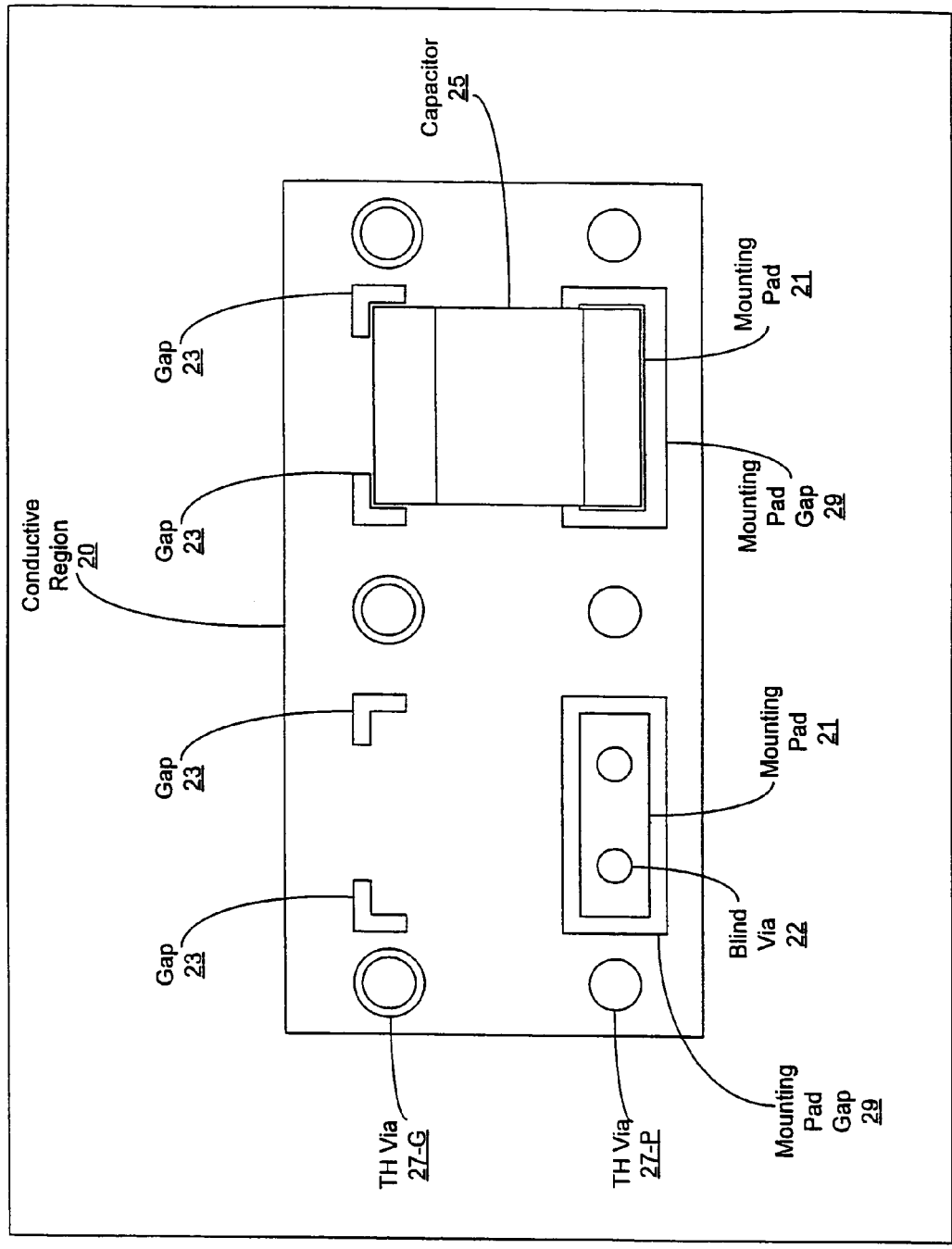
FIG. 2 is a drawing of one embodiment of a conductive region on the surface of the PCB, wherein two electrically isolated mounting pads are located within the conductive region.

FIG. 2 is a drawing of one embodiment of a conductive region on the surface of the PCB, wherein two electrically isolated mounting pads are located within the conductive region. More particularly, FIG. 2 illustrates an exemplary conductive region configured for mounting two capacitors. A capacitor 25 is mounted in one of the locations on conductive region 20. For illustrative purposes, the other location is shown without a capacitor mounted.

Conductive region 20 includes two mounting pads 21 configured for coupling to a capacitor terminal. Each mounting pad 21 is located within the confines of the area of conductive region 20. Furthermore, each mounting pad is electrically isolated from conductive region 20 by a mounting pad gap 29. Each mounting pad gap 29 may be implemented using non-conductive material such that current cannot flow directly between conductive region 20 and mounting pad 21.

Each mounting pad 21 is electrically coupled to one or more blind vias 22, which are located directly under mounting pad 21. The blind vias 22 provide a connection that electrically couples mounting pad 21 to a circuit plane (such as first circuit plane 41 shown in FIG. 1). The electrical coupling of mounting pad 21 to an associated circuit plane using more than one blind via may reduce the amount of inductance in the connection between the two. Since electrical current will tend to distribute itself between the multiple blind vias 22, each of them is thus required to carry less current overall than a single blind via between mounting pad 21 and a circuit plane. Furthermore, as shown in FIG. 1, each of the blind vias 22 may be wider than a typical via, and may thus have more current carrying capacity.

In the embodiment shown, a pair of gaps 23 is associated with mounting pad 21. These gaps 23 effectively define a location for the capacitor terminal opposite of the one coupled to mounting pad 21. Each of the gaps 23 may be implementing a material that is non-conductive. Furthermore, the material used to implement gaps 23 may be such that it resists bonding to solder, conductive glue, or any other type of bonding material used to attach and secure a capacitor terminal to conductive region 20. For example, each of the gaps 23 may be implemented with a type of fiberglass that is commonly used in the construction of PCB's. By using such a material in gaps 23, soldering a capacitor terminal to conductive region 20 may be simplified, and may lessen the tendency of a capacitor to drift during the process if it is not held in place by glue or other means.

The implementation of gaps 23 in FIG. 2 represent one possible embodiment of such gaps. Other embodiments may implement gaps having different sizes and shapes. Furthermore, the number of gaps 23 used to define the location for a capacitor terminal to be mounted to conductive region 20 may also be varied in different embodiments.

As illustrated in FIG. 2, a capacitor 25 is shown mounted in one of the locations on PCB 6. A first terminal of the capacitor 25 is coupled to conductive region 20 in the area defined by a pair of gaps 23. The second terminal of capacitor 25 is coupled to a mounting pad 21 located within the confines of conductive region 20. FIG. 2 thus illustrated configuration for mounting capacitors to a PCB that is an alternative to the traditional use of small mounting pads for each of the capacitor terminals.

Figure 3:
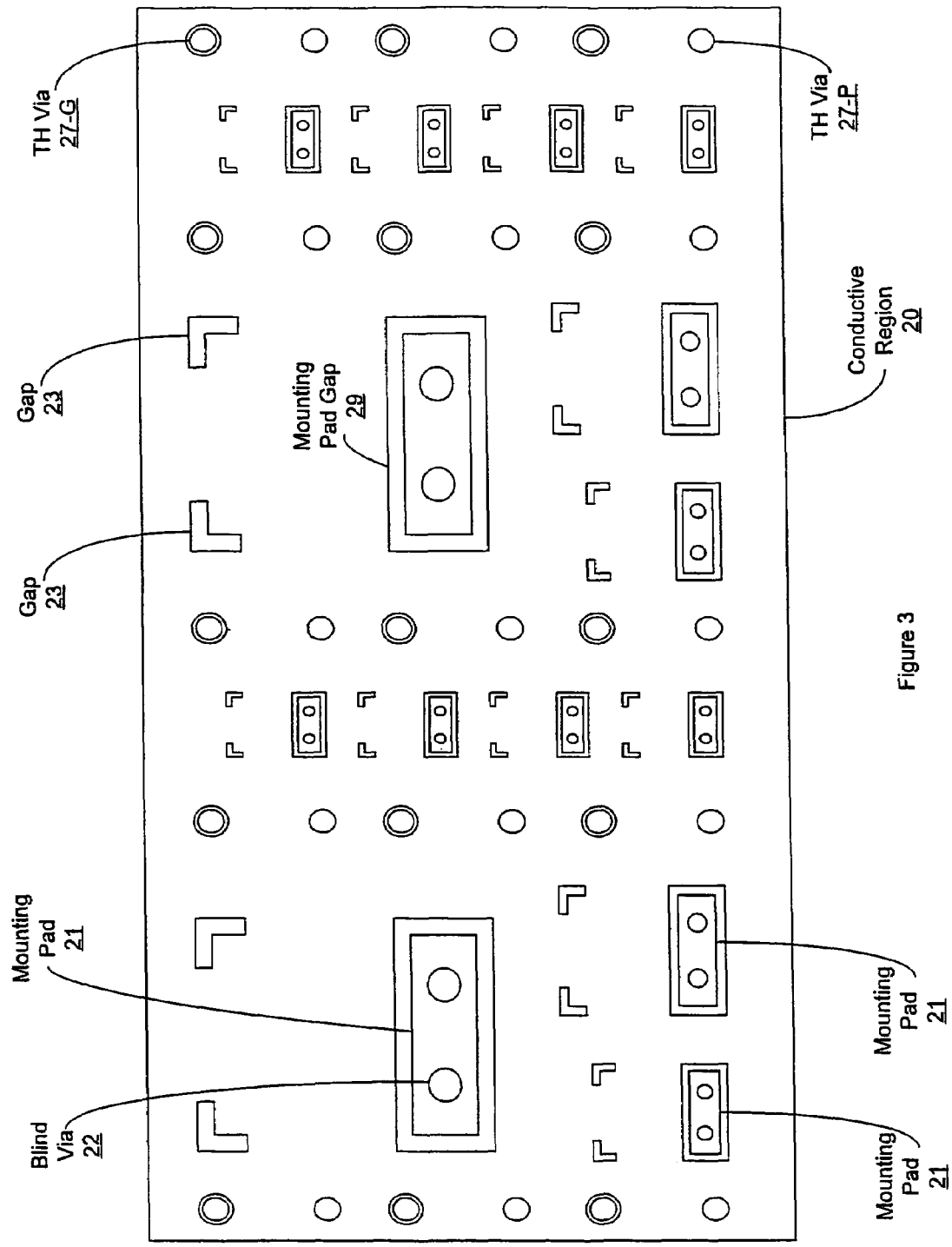
FIG. 3 is a drawing of one embodiment of a conductive region on the surface of the PCB having a plurality of electrically isolated mounting pads, wherein the mounting pads enable a plurality of different-sized decoupling capacitors to be mounted; and While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

FIG. 3 is a drawing of one embodiment of a conductive region on the surface of the PCB having a plurality of electrically isolated mounting pads, wherein the mounting pads enable a plurality of different-sized decoupling capacitors to be mounted. In the embodiment shown, conductive region 20 includes a plurality of pairs of gaps 23. Associated with each pair of gaps 23 is a corresponding mounting pad 21, each mounting pad 21 being electrically isolated from the surrounding portion of conductive region 23. The combination of each of the pairs of gaps 23 and their corresponding mounting pads 21 define a location for mounting a capacitor onto a PCB upon which conductive region 20 is implemented. As shown in the drawing, these capacitors may be of varying sizes (although embodiments configured for mounting a single size and type of capacitor are also contemplated). By mounting capacitors of different sizes, and thus different capacitance values, and thus provide decoupling for a wide frequency range.

As noted above, the use of conductive region 20 for providing an area for mounting decoupling capacitors may reduce the amount of inductance (and thus impedance) in a power distribution system on a circuit carrier such as a PCB. Since one terminal is coupled directly to a relatively large PCB, there is no need to provide blind vias directly under the terminal as in embodiments where both terminals are mounted to relatively small mounting pads.

Vias connecting conductive region 20 to a circuit plane may be located wherever is convenient instead of being forced to be located underneath a pad. Thus, instead of forcing current through vias directly under the pad for both of the terminals, current from the terminal coupled to the conductive region 20 may be allowed to distribute itself about a larger area. In the embodiment shown, conductive region 20 is coupled to a power plane by TH vias 27-P (alternate embodiments connecting conductive region 20 to a ground plane by vias are also contemplated). As such, conductive region 20 effectively forms a mini power plane on the surface of the PCB upon which it is implemented. The current carrying capacity of conductive region 20 reduces the current load that its associated circuit plane is required to carry. Furthermore, the relatively large number of vias between conductive region 20 and its associated circuit plane tends to reduce the amount of current that must be carried by any one particular via.

The use of the conductive regions such as that shown in the various drawings, along with the relative location of the various circuit planes further illustrates the manner in which inductance can be reduced in the current loop between a power plane and a ground plane. Referring back to FIG. 1, it is noted that the circuit plane that is coupled to a mounting pad 21 is located in first layer 31, which is the layer nearest to surface layer 30. This is due to the fact that the mounting pad 21 does not provide the same amount of area to distribute itself about, as does conductive region 20. Thus, by placing first circuit plane 41 as close as possible to mounting pad 21, the distance of the current loop (and thus inductive impedance) is minimized. The use of multiple vias connecting mounting pad 21 to its associated circuit plane, as shown in FIGS. 2 and 3, provides additional current carrying capacity between the two. Second circuit plane 42 is located as close as possible to conductive region 20 while allowing for the above-mentioned location of first circuit plane 41. This location of second circuit plane 42 reduces the distance in the current loop between itself and conductive region 20. The use of conductive region 20 along with multiple vias, also provides additional current carrying capacity. In general, the increased current carrying capacity provided by conductive region 20 and the use of multiple vias, along with the location of power and ground planes as close as possible to the decoupling capacitors may result in a low inductance current loop in the power distribution system and therefore help to keep the overall impedance of the power distribution system at a minimum.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A printed circuit board (PCB) comprising:
    a surface layer;
    a first circuit plane in a first layer;
    a second circuit plane in a second layer, wherein the second layer is adjacent to the first layer;
    a conductive region on the surface layer, wherein the conductive region is electrically coupled to the first circuit plane by one or more vias; and
    a mounting pad located within the conductive region, wherein the mounting pad is electrically isolated from the conductive region by a mounting pad gap surrounding the mounting pad, and wherein the mounting pad is coupled to the second circuit plane by a via;
    wherein the conductive region is arranged for receiving a first terminal of a capacitor and the mounting pad is arranged for receiving a second terminal of the capacitor.

2. The PCB as recited in claim 1 further comprising a plurality of mounting pads within the conductive region, wherein each of the plurality of mounting pads is electrically isolated from the conductive region by an associated mounting pad gap surrounding the respective mounting pad, wherein each of the plurality of mounting pads is electrically coupled to the second circuit plane.

3. The PCB as recited in claim 1 further comprising a first gap in the conductive region, wherein the first gap is positioned such that it is adjacent to the first terminal when the first terminal of the capacitor is coupled to the conductive region and the second terminal of the capacitor is coupled to the mounting pad.

4. The PCB as recited in claim 3 further comprising a second gap in the conductive region, wherein the second gap is adjacent to the first gap.

5. The PCB as recited in claim 1, wherein the first circuit plane is a power plane and the second circuit plane is a ground plane.

6. The PCB as recited in claim 1, wherein the first circuit plane is a ground plane and the second circuit plane is a power plane.

7. The PCB as recited in claim 1 further comprising a third circuit plane in a third layer, wherein the third layer is adjacent to the second layer.

8. The PCB as recited in claim 7, wherein the third circuit plane is electrically coupled to the second circuit plane.

9. The PCB as recited in claim 7 further comprising a fourth circuit plane in a fourth layer, wherein the fourth layer is adjacent to the third layer.

10. The PCB as recited in claim 9, wherein the fourth circuit plane is electrically coupled to the first circuit plane.

11. The PCB as recited in claim 2, wherein the plurality of mounting pads includes a first subset of mounting pads having a first size and a second subset of mounting pads having a second size different from the first size.

12. The PCB as recited in claim 1, wherein each of the plurality of mounting pads is coupled to the second circuit plane by one or more blind vias located under the respective mounting pad.

* * * * *